United States Patent [19]

Hug et al.

[11] Patent Number: 4,572,421

[45] Date of Patent: Feb. 25, 1986

[54] APPARATUS FOR FEEDING WIRE TO A WIRE BONDING MECHANISM

[75] Inventors: Paul Hug; William Umeda; Paul Chapdelaine; Raymond E. Paul, all of Santa Clara County, Calif.

[73] Assignee: Storage Technology Partners, Louisville, Colo.

[21] Appl. No.: 533,681

[22] Filed: Sep. 19, 1983

[51] Int. Cl.[4] .................................... H01L 21/92
[52] U.S. Cl. ...................... 228/103; 228/4.5; 228/179; 226/44; 226/108; 226/111
[58] Field of Search ............ 228/4.5, 179, 103; 226/108, 111, 115, 44

[56] References Cited

U.S. PATENT DOCUMENTS 3,612,369 10/1971 Grebe et al. .............. 226/115 X
3,646,307 2/1972 Hazel .............................. 228/4.5
4,422,583 12/1983 Maxner et al. ............. 226/115 X

*Primary Examiner*—Kenneth J. Ramsey
*Attorney, Agent, or Firm*—Bryant R. Gold; James R. Young

[57] ABSTRACT

An apparatus for supplying wire to a wire bonding mechanism is presented. Lengths of wire are fed to a low mass wire-loop reservoir while the bonding process is taking place. Wire is then supplied, at a high speed, from the wire-loop reservoir for the next bonding operation. The amount of wire supplied is precisely measured by measuring the change in the amount of wire stored in the reservoir. The apparatus can supply both single lead wire and twin lead wire. When twin lead wire is supplied, the two wires of the twin lead are separated at predetermined points before being fed to the wire-loop reservoir.

14 Claims, 5 Drawing Figures

APPARATUS FOR FEEDING WIRE TO A WIRE BONDING MECHANISM

BACKGROUND OF THE INVENTION

This invention relates to wire handling apparatus. More particularly, it relates to an apparatus which feeds precisely known amounts of wire to a bonding mechanism that bonds the wire to a printed circuit board at a rate which does not slow down the bonding process. Even more particularly, it relates to an apparatus which, when twin lead wire is being bonded, separates the two wires of the twin lead at the appropriate places before it is fed to the bonding mechanism so that each wire of the twin lead can be readily bonded.

A typical subassembly in the electronics manufacturing industry consists of integrated circuits (IC's) soldered to a printed circuit board (PCB). The PCB has printed wiring traces, typically on internal layers, which interconnect the circuits of the IC's. Quite often, it is necessary to add discrete wire between selected pads of the PCB, e.g., to tune clock signals, to complete the interconnections which could not be made with printed wire due to lack of space, to correct mistakes in the design, etc. When the amount of wire to be added becomes excessive, it is common practice to build a bonding mechanism, usually semi-automated, to speed up this process of adding discrete wires to the PCB.

In the prior art such semi-automated mechanisms consists of a controller, an X-Y table, a wire feeder, a wire bonder, e.g., a thermo-compression head, an ultrasonic head, a laser beam, etc., and an operator. The PCB is placed on the X-Y table, and the controller then moves the X-Y table until the first pad of the PCB at which a wire is to be bonded is positioned under the wire bonder. The wire feeder then feeds the end of the wire and the operator holds it on the pad while the bonder attaches it. The controller then moves the table to position the second pad under the wire bonder that is to have the other end of the wire bonded to it. The operator again holds the wire on the pad while it is bonded and then cuts the wire at the bond on the side closest to the wire feeder. The table is moved to position the first pad of the second wire under the bonder, the operator holds the end of the wire on the pad for bonding, the X-Y table is moved to position the second pad for the second wire, and so on until all the wires have been added to the printed circuit board.

Disadvantageously, the wire feeder as above described has several inherent problems. The first problem is speed. The X-Y table can be repositioned in a relatively short time. However, while the wire itself has little mass (the diameter of the wire being bonded in usually on the order to a thousandth of an inch), the spool that holds the wire has a large mass. Hence, if the wire feeder attempts to move wire to the bonder too rapidly, the wire may break if the large mass spool can not be accelerated at the same rate. If the wire is gradually accelerated to prevent breakage, a braking mechanism must be added to the spool to stop it when the feeding stops. The typical solution to this problem in the prior art is to feed the wire at a rate which does not cause the spool to turn at a high speed. Unfortunately, this rate takes longer to feed the wire than it does to move the X-Y table, slowing down the process.

Another problem with prior art wire feeders is controlling the length of wire being fed. The wire being bonded should be long enough to provide a small amount of slack to prevent stress and to allow the strand of wire between the two pads to be moved slightly by the operator to expose other pads for subsequent bonding. However, the wire must not be too long. Otherwise, wire build up, also called "mounding", may occur. Further, in the case of clock tuning, an exact length is desired.

A wire feeder typically includes a least one pair of pinch rollers, that is, two cylinders of suitable material such as hard rubber that circumferentially touch each other along their length. One cylinder is driven while the other idles on its shaft, and the wire to be fed passes between the two cylinders. When the driven cylinder turns, friction causes the idler cylinder to also turn, which causes the wire to move. The length of wire moved is determined by the amount of rotation of the driven roller. Unfortunately, wire slippage occurs, especially during the initial movement, which causes the amount of wire being fed to be less than calculated. In the prior art, attempts are made to compensate for the slippage by feeding more wire than desired. The result is a length of wire to be bonded that is close to the desired length, but which length has an unknown error therein.

A third disadvantage of the wire feeders of the prior art is their inability to efficiently handle twin lead wire. (Twin lead wire, consisting of two insulated wires held a constant distance apart by a manufacturing process which melts or glues their insulations together, is used when a controlled impedance transmission line is required.) When twin lead wire is used, the operator must cause both wires of the twin lead to be bonded on their respective pads. Mechanisms of the prior art either leave it up to the operator to manually separate the two leads prior to bonding, or attempt to separate them before being fed to the operator.

When the twin lead is separated before being fed to the bonding position, it is typically done by a solenoid actuated blade, or pin, that is driven between the leads as they move by on a rotating cylinder or drum. Unfortunately, the rotating cylinder has some amount of eccentricity and wobble caused by the rotation about its axis. Because of the wobble and eccenricity, the splitting blade may go too deep and be dulled by striking the cylinder, not go deep enough and not split the wires, or cut into the insulation of one or both of the wires, thereby exposing the wire to a potential short after bonding.

It is therefore apparent that a need exists in the art for an apparatus to feed wire to a bonding mechanism which can feed a precise amount of wire at a speed which does not slow down the bonding process, and which can consistently split twin lead wire as required. The present invention advantageously provides such a mechanism.

SUMMARY OF THE INVENTION

It is an object of the present invention to provide an apparatus for feeding wire to a wire bonding mechanism that feeds precisely known lengths of wire at a rate that does not slow down the bonding process.

A further object of the invention is to provide such a wire feeding apparatus that has the capability of handling twin lead wire as well as single lead wire.

Another object of the invention is to provide such a wire feeding apparatus that can consistently and reliably separate the two wires of twin lead, at desired locations along the length of the wire, when twin lead wire is being fed by the apparatus.

The above and other objects of the invention are realized through a wire feeding apparatus that includes the use of a wire reservoir or buffer and a unique wire splitter. Wire is fed into the reservoir at a slow rate while the wire bonding process is taking place, thereby avoiding the problems caused by rapid acceleration or deceleration. Wire is fed out to the reservoir to the bonding mechanism as the controller moves the X-Y table. Advantageously, the wire reservoir is a very low mass system and wire being fed therefrom can be accelerated and decelerated in a rapid manner at a rate that matches the table movement. Thus, the bonding process is not slowed down as wire is being fed.

The amount of wire in the reservoir is continuously measured by a shaft encoder that measures the rotation of a pivot or swing arm that forms a variable length wire loop that makes up the reservoir. Thus, the amount of wire being fed into, or fed out of the reservoir is independent of any slippage that may occur in the pinch rollers feeding wire into, or removing wire out of, the reservoir. This feature of the invention allows the length of wire being fed to the bonding station to be precisely known, within the accuracy of the shaft encoder measuring system.

Advantageously, the wire feeding apparatus of the present invention can handle both single wire and twin lead wire. When twin lead is being handled, it can also be split with a wire splitter that comprises a solenoid-actuated blade and a stationary surface. The stationary surface has a groove machined in it which is slightly wider than the width of the twin lead wire to be split. The twin lead wire is constrained to slide through this groove as it is being fed into the reservoir, and the width of the groove holds the position of the twin lead constant with respect to the unactuated blade. When the solenoid is actuated, the blade passes between the two wires, separating them without removing the insulation from either, into a slot in the stationary surface. The stationary surface removes any wobble or eccentricity inherent in the rotating splitting devices of the prior art, and the slot prevents dulling of the blade.

Since the amount of wire being fed into the reservoir is being precisely measured, this measurement can be monitored by a controller and the controller can actuate the solenoid at the desired position, for the desired length of time, to feed pre-split lengths of twin lead into the reservoir.

BRIEF DESCRIPTION OF THE DRAWINGS

The above and other objects, features and advantages of the present invention will be more apparent from the following more detailed description thereof, presented in conjunction with the following drawings, wherein.

DESCRIPTION OF THE PREFERRED EMBODIMENT

The following is a description of the best presently contemplated mode of carrying out the present invention. This description is given only to illustrate the general principles of the invention and is not to be taken in a limiting sense. To ascertain the true scope of the invention, reference should be made to the appended claims.

Figure 1:
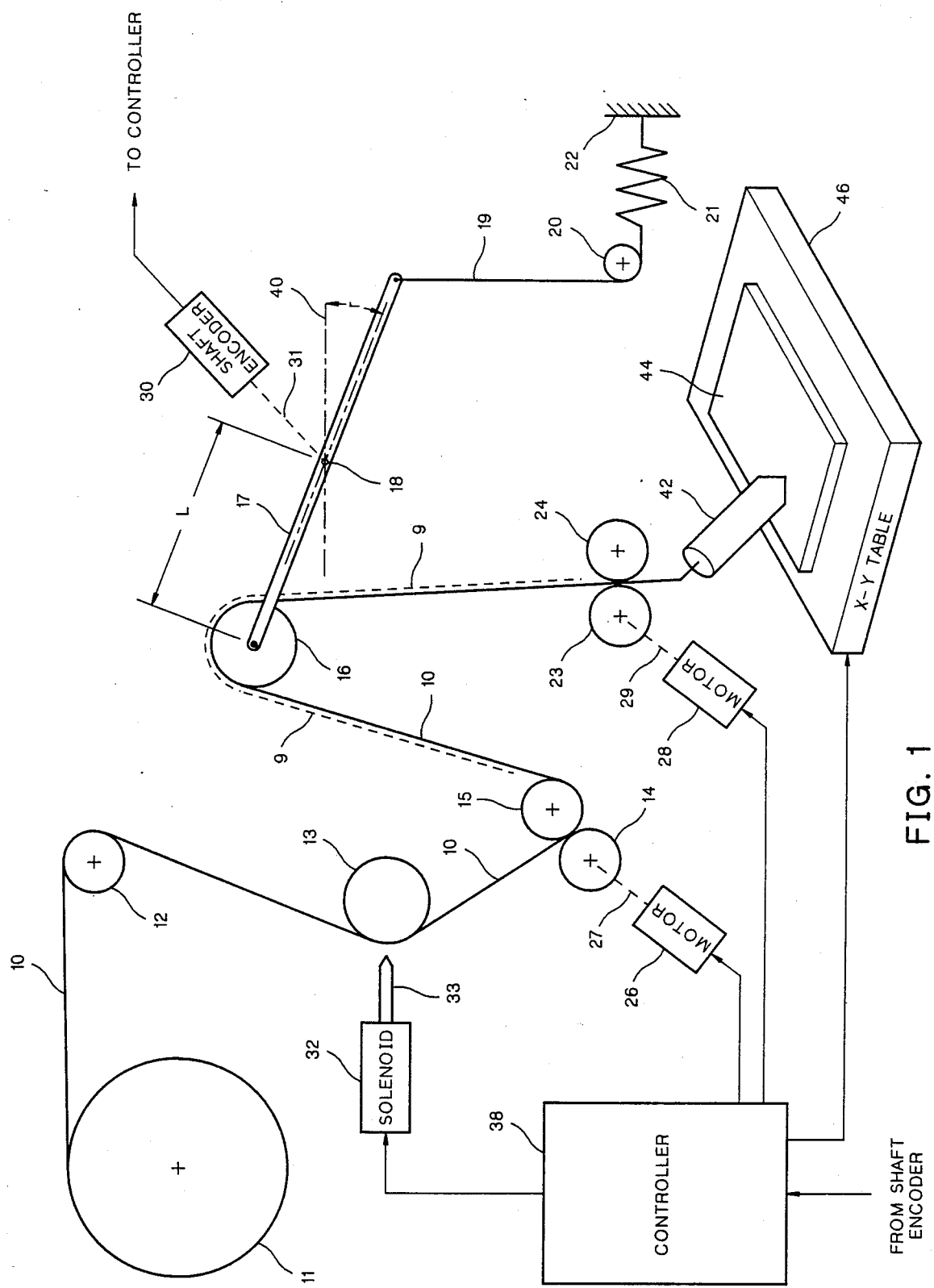
FIG. 1 is a schematic drawing showing the principal elements of the invention and illustrating the principles of operation of the invention.

FIG. 1 is a schematic drawing depicting the elements of the invention. A wire spool 11 supplies a continuous length of wire 10, which is threaded around an idler wheel 12, over the stationary part of a twin lead wire splitter 13, between a first pinch roller pair 14–15, around an idler wheel 16 and between a second pinch roller pair 23–24.

The drive roller 14 of the first pinch roller pair 14–15 is mechanically coupled, as indicated by the dashed line 27, to a drive motor 26; while the drive roller 23 of the second pinch roller pair 23–24 is mechanically coupled, as indicated by the dashed line 29, to a drive motor 28. The first pinch roller pair 14–15 feeds wire into a wire reservoir 9 (a wire loop, represented as a dashed line in FIG. 1) when the idler roller 15 is in contact with the drive roller 14, while the second pinch roller pair 23–24 removes wire from the reservoir 9 and supplies it to a suitable bonding mechanism 42 when the idler roller 24 is in contact with the drive roller 23. The bonding mechanism 42 attaches the wire 10 at a desired location on a printed circuit board (PCB) 44, which PCB is positioned relative to the bonding mechanism 42 by an X-Y table 46.

The reservoir mechanism 9 is a key feature of the invention and comprises an idler wheel 16; a pivot arm 17; a steel wire 19; an idler wheel 20; and a spring 21, which spring has one end attached to a rigid portion 22 of the structure which supports the invention.

The wire-loop reservoir, represented by the dashed line 9, holds that amount of wire 10 stored between the pinch roller 15, around the idler wheel 16, and up to the pinch roller pair 23–24. A shaft encoder 30 is mechanically coupled, as indicated by the dashed line 31, to a pivot point 18 of the pivot arm 17. The shaft encoder continuously measures the angular position of the pivot arm 17 by measuring the angle "r" that the arm 17 makes with a reference axis 40. (The theory and operation of shaft encoders is well understood in the art, and those skilled in the art could readily use a shaft encoder to measure angular position as shown.)

In operation, the reservoir 9 functions as follows: If the pinch rollers 23–24 remove wire 10 from the reservoir 9, the idler wheel 16 is pulled in a downward direction. This causes the other end of the pivot arm 17 to rise and the steel wire 19 will cause the spring 21 to stretch; if the pinch rollers 14–15 add wire 10 to the reservoir 9, the spring 21 pulls down the steel wire 19 and the end of the pivot arm to which it is attached, causing the idler wheel 16 to move upward. Thus, the spring 21 always keeps the length of wire 10 held within the wire-loop reservoir 9 taut.

As a length of wire 10 is fed into or removed from the reservoir 9, the shaft encoder measures the angular position of the pivot arm 17. The change in the length of wire held in the reservoir 9 is directly proportional to the amount of rotation of the pivot arm. This change many be quantified as 2RL, where R is the amount of change in rotation in radians (the change in the angle r)

and L is the length of the pivot arm 17, from the pivot point 18 to the center of the idler wheel 16.

Also shown in FIG. 1 is the twin lead wire splitting mechanism that comprises an electrically actuated solenoid 32, a cutting blade 33, and a stationary surface 13. A desired embodiment may include an apparatus which can feed either single lead wire or twin lead wire. That is, the two types of wire may be threaded in parallel from respective spools, through respective pinch rollers that feed the reservoir, through respective reservoirs, and through respective pinch rollers that remove wire from the reservoirs. In this parallel embodiment, only one type of wire is fed and measured at any one time. The pinch rollers have a common drive roller but a separate idler roller for each type of wire. The idler rollers are mounted on arms so that they can selectively be pivoted to make contact with the drive roller or swung out of the way. The desired wire is fed only when the proper idler roller is engaged with the drive roller. The shaft of the shaft encoder passes through the pivot arms of both reservoirs, but only one of the pivot arms is mechanically coupled to the shaft encoder at any one time. This is done by sliding a key along the shaft encoder shaft to mechanically engage the appropriate pivot arm. The operating principles of the invention, however, are the same (except for the twin lead wire splitter, which will be explained later) whether the system is capable of feeding single lead wire, twin lead wire or both. Therefore, that which is shown in FIG. 1 for the twin lead feeding apparatus is sufficient to teach the operating principles of whatever type of system is employed.

Figures 2, 3:
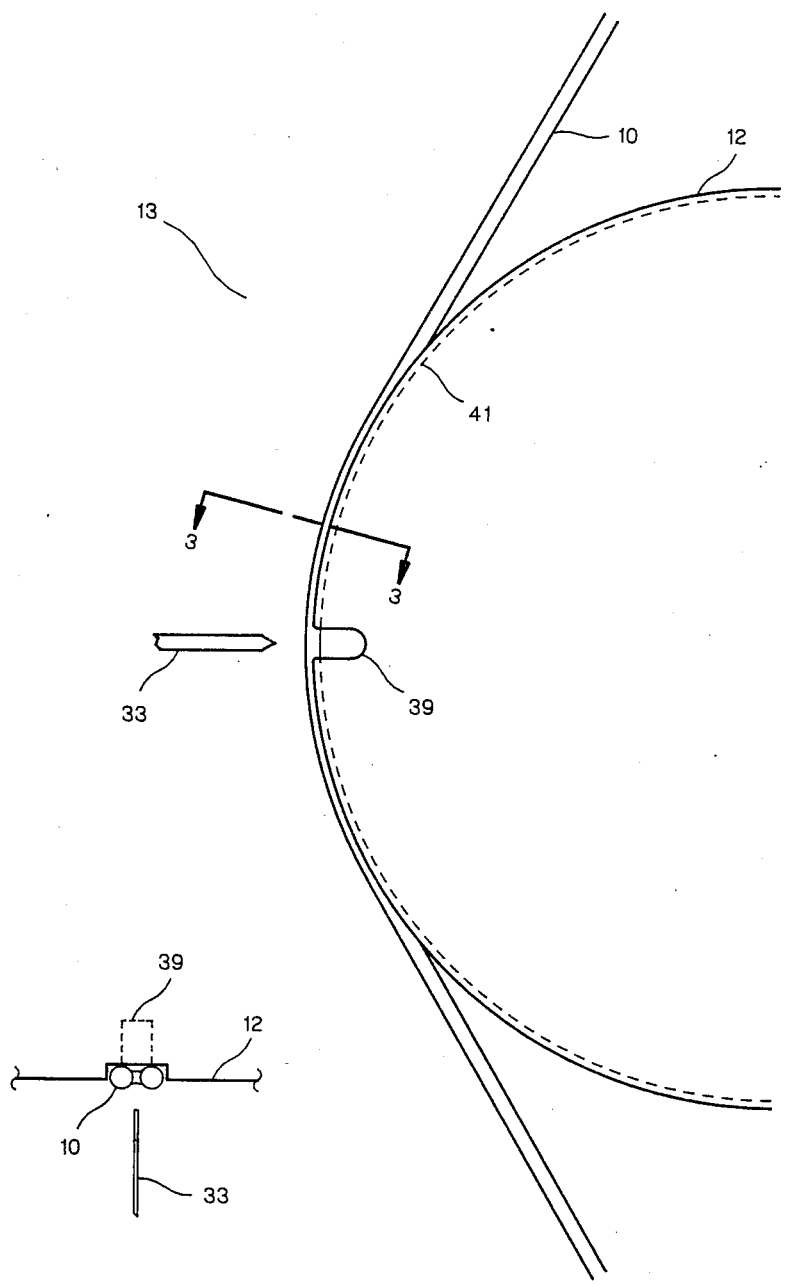
FIG. 2 is a side view of the twin lead wire splitter of the invention.
FIG. 3 is a cross sectional view taken along the lines 3—3 of FIG. 2.

FIG. 2 shows the detail of the twin lead wire splitter 13. The wire 10 slides along a groove 41 in the surface of a stationary piece 12. A slot 39 is machined in the surface 12 directly opposite the cutting blade 33. FIG. 3 is a sectional view, looking down on the wire 10 in the groove 41. The groove 41 is only slightly wider than the width of the twin lead wire 10. This assures that as the wire 10 slides along in the groove, the center portion to be cut will always be aligned with the blade 33. The slot 39 provides a recess for the blade 33 to enter when it is separating the wires of the twin lead 10 without striking a surface and dulling the blade 33.

A unique feature of the wire splitter of the invention is that the surface 12 is stationary. In the prior art, all wire splitters known to the inventor rotate, as they are part of an idler. A rotating element has an inherent amount of wobble and eccentricity. This causes the center portion between the leads to vary with respect to the cutting blade. This can cause the blade to not penetrate deep enough to split the wires, go too deep and dull itself against the idler, or cut the insulation of one of the wires and cause an electrical short when bonded.

Referring again to FIG. 1, the advantages of the invention may now be described. The invention is preferrably controlled by a suitable controller 38, such as a general purpose mini-computer which has a wire list of the wires to be bonded stored in its memory. The PCB 44 is aligned on the X-Y table 46 and the controller 38 causes the first pad which is to have a wire bonded thereto to be positioned under the bonding mechanism 42. At the same time the controller causes the pinch rollers 14-15 to fill the reservoir 9 with wire 10 from the supply spool 11. This action causes the pivot arm 17 to rise to its maximum upward position.

The feed rollers 23-24 then feed the end of the wire 10 from the reservoir 9 to the operator, thereby lowering the pivot arm 17. The operator positions the wire on the pad and causes it to be bonded and signals the controller 38 that bonding has occurred.

The controller 38 then positions the X-Y table so that the next pad is under the bonding mechanism while simultaneously causing pinch rollers 23-24 to feed the precise, predetermined amount of wire from the reservoir 9. Since the shaft encoder 30 is continually measuring the angular position of the pivot arm 17, and since this information is continually being made available to the controller, the controller can accurately determine when the correct amount of wire has been fed.

While the operator is causing the wire to be bonded, the controller causes pinch rollers 14-15 to refill the reservoir. If the wire just bonded is the end of a string of connections, the operator will but the wire adjacent to the bond on the pinch roller 23-24 side, and holds the end of the wire for the next pad. If the wire is to go to another pad as part of a serial hookup, it is not cut. The process of moving the X-Y table and feeding wire is repeated until all the wires have been added to the PCB as desired.

An important feature of the invention is the wire-loop reservoir 9. Because the spool 11 represents a large mass system that can not be accelerated rapidly by the pulling of the small diameter wire 10, the reservoir 9 allows the spool 11 to be moved slowly, while the relatively long bonding process is taking place. The pivot arm 17 and idler wheel 16, however, represent a low mass system that can advantageously be accelerated and decelerated rapidly by the pinch rollers 23-24 pulling wire from the reservoir 9. Thus, the reservoir 9 allows wire to be fed to the bonding mechanism as rapidly as the X-Y table can be moved.

Another key feature associated with the wire-loop reservoir 9 is that it allows the amount of wire being fed thereto or therefrom to be accurately measured. As explained previously, it is advantageous to know how much wire is being fed to the bonder 42; and, as will be explained later, it is also advantageous, in the case of twin lead, to know how much wire is being fed into the reservoir. Since the wire in the reservoir 9 is proportional only to the angle of the pivot arm 17, any slippage of the wire in the pinch rollers is eliminated from the measurement.

When twin lead is used, the two wires must be separated at the ends of each length so that wire can be bonded to its respective pad. In many cases, twin lead wire forms a serial path between many pads. In these cases, it is advantageous to separate the twin leads enough so that both leads may be bonded to their respective pads at each point of the serial string, but not to separate them so much as to cause the twin lead to appear as a high impedance transmission line. The precise measuring capability of the invention allows the proper separation to be realized. As the twin lead passes over the stationary element 13, the controller 38 can determine precisely when the separation should start from the continuous measurement of the shaft encoder 30, and energize the solenoid 32 at this precise time. When the separation has been performed for the predetermined length, again from the measurement of the shaft encoder, the solenoid 32 is de-energized.

Figure 4:
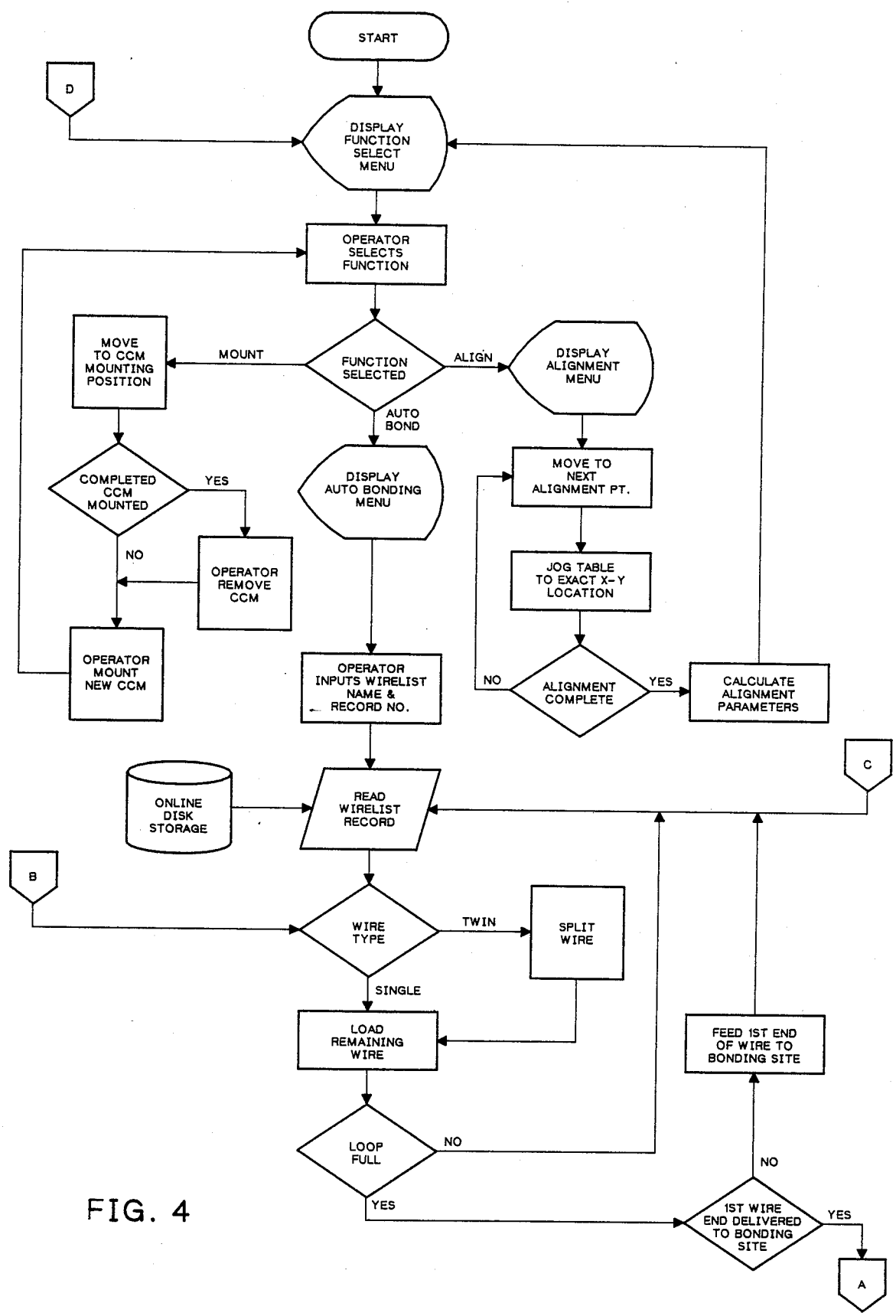
FIGS. 4 and 5 contain a flow chart depicting a method of controlling the present invention.
Figure 5:
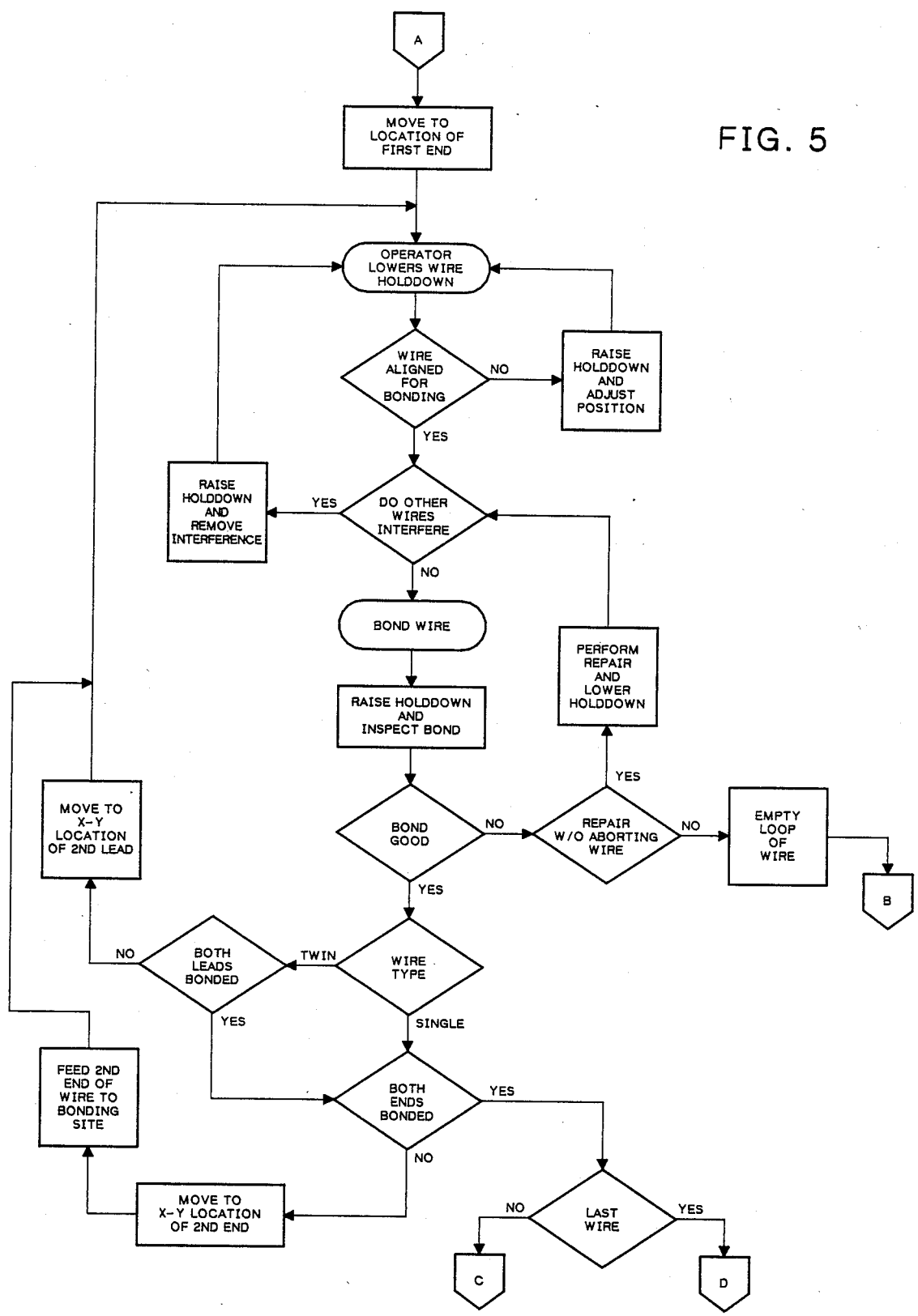

A flow chart of a program that could be used by a mini-computer (functioning as the controller 38) to control the operation of the wire feeding apparatus is shown in FIGS. 4 and 5.

Even though a general-purpose mini-computer is used as the controller 38, it is to be emphasized that any form of controller, e.g., a control system designed around a micro-processor, a discrete logic controller, etc., could be used for this function. The main features and advantages of the invention, as described above, will be the same regardless of the type of controller 38 used. Further, any appropriate bonding mechanism 42 and X-Y table 46 (FIG. 1) may be used with the wire feeding apparatus.

What is claimed is:

1. Apparatus for feeding precise lengths of wire to a bonding mechanism used to bond respective ends of said wire to pads of a workpiece, said wire feeding apparatus comprising:

feeding means for feeding said wire from a supply stool into a storage means;

removing means for taking said wire from said storage means and supplying it to said bonding mechanism;

storage means for storing said wire fed from said supply spool comprising:

a rotating arm having first and second ends, said arm being adapted to rotate a partial revolution about a pivot point located intermediate said first and second end, a roller attached to said first end about which said stored wire is looped from fixed points of said feeding means and removing means, and spring bias means attached to the second end of said arm for biasing said second end, and thereby rotating said arm towards a first position, whereby the rotation of said arm raises and lowers the first end thereof, thereby increasing and decreasing the wire loop size as measured from said fixed points, which wire loop size, held taut by said spring bias means, determines the amount of wire stored in said storage means;

measuring means for measuring the amount of said wire being fed into, removed from, or stored in said storage means; and controlling means for controlling the operation of said feeding, removing, and measuring means.

2. The wire feeding apparatus of claim 1 wherein said feeding and removing means each comprise a pinch roller mechanism.

3. The wire feeding apparatus of claim 1 wherein said measuring means comprises a means for measuring the angular position of said rotating arm relative to a fixed reference point, whereby the length of said wire loop, and hence the amount of wire stored in said storage means, can be readily determined.

4. The wire feeding apparatus of claim 3 further including splitting means for use when said wire is twin lead wire comprising:

a stationary surface having a groove therein that is slightly wider than the width of said twin lead wire, located between said feeding means and said storage means;

means for passing said twin lead wire through said groove as it is fed into said storage means by said feeding means;

means for selectively raising and lowering a cutting blade that cuts into the center of said twin lead wire when said blade is lowered, thereby separating the twin leads thereof; and means for preventing said blade from touching the bottom of said groove when it is in its lowered cutting position.

5. The wire feeding apparatus of claim 4 wherein said means for selectively raising and lowering said cutting blade comprises a solenoid having a plunger to which said blade is coupled, said solenoid being activated by a control signal received from said controlling means.

6. The wire feeding apparatus of claim 5 wherein said angular position measurement means comprises a shaft encoder coupled to a rotating shaft that rotates with said rotating arm.

7. The wire feeding apparatus of claim 6 wherein said shaft encoder generates a signal indicating the rotational position of said shaft relative to a known reference point, said signal being transmitted to said controlling means.

8. The wire feeding apparatus of claim 7 wherein said controlling means comprises a computer programmed to generate control signals for controlling the turn-off/turn-on functions of said feeding, removing, and splitting means.

9. A method for feeding precise lengths of wire to a wire bonding apparatus comprising:

(a) feeding an unknown amount of a wire from a supply spool to a storage reservoir said reservoir comprising a variable length wire loop, the length of said loop being determined by the rotational position of a swing arm having a pulley at one end thereof about which the wire is looped;

(b) measuring the rotational position of said swing arm to determine the amount of wire in said reservoir;

(c) withdrawing a desired amount of wire from the reservoir; and (d) presenting the desired amount of wire to the wire bonding apparatus.

10. The method of claim 9 wherein the precise amount of wire withdrawn from the reservoir in step (c) is determined by measuring the change in the amount of wire stored in said reservoir.

11. The method of claim 10 wherein the feeding of the wire from the supply spool into the reservoir in step (a) is carried out at a speed much slower than the withdrawing of the wire from the reservoir in step (c), thereby obviating the need for the supply spool, typically having a relatively large mass, to be rapidly accelerated or decelerated.

12. A method for feeding precise lengths of wire to a wire bonding apparatus comprising:

(a) storing a length of wire received from a supply spool in a variable length wire loop including maintaining the wire taut by looping the wire around a pulley at one end of a swing arm, and biasing the swing arm with a suitable resilient force so as to pull the wire taut around the pulley;

(b) withdrawing a desired measured length of wire from said wire loop as measured by measuring the change in rotational position of said swing arm;

(c) presenting said measured length to said wire bonding apparatus; and (d) replenishing the wire stored in said wire loop with an additional length of wire as said wire bonding apparatus effectuates a bond with the wire presented in step (c).

13. The method of claim 12 wherein the storing of the wire in the variable length wire loop of step (a) is carried out at a slower rate than is the withdrawing of the wire from the wire loop of step (b).

14. The method of claim 13 further including selectively splitting the ends of said wire, when said wire is twin lead, prior to storing the wire in said variable length wire loop.

* * * * *